(12) United States Patent
Brown et al.

(10) Patent No.: US 7,804,366 B2
(45) Date of Patent: Sep. 28, 2010

(54) MILLIMETER WAVE MONOLITHIC INTEGRATED CIRCUITS

(75) Inventors: Kenneth W. Brown, Yucaipa, CA (US); Andrew K. Brown, Victorville, CA (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 12/575,389

(22) Filed: Oct. 7, 2009

(65) Prior Publication Data

US 2010/0109776 A1   May 6, 2010

Related U.S. Application Data

(63) Continuation-in-part of application No. 12/266,229, filed on Nov. 6, 2008.

(51) Int. Cl.
*H03F 3/04* (2006.01)
(52) U.S. Cl. ........................................ 330/307; 330/310
(58) Field of Classification Search ................. 330/307, 330/310, 150, 98, 302
See application file for complete search history.

(56) References Cited

U.S. PATENT DOCUMENTS

| | | | |
|---|---|---|---|
| 5,412,347 A | 5/1995 | Minnis | |
| 5,551,075 A * | 8/1996 | Caux et al. | 455/333 |
| 5,563,551 A | 10/1996 | Kashiwa | |
| 6,259,335 B1 | 7/2001 | Ingram | |
| 6,583,673 B2 | 6/2003 | Ahl et al. | |
| 6,943,631 B2 * | 9/2005 | Scherrer et al. | 330/310 |
| 7,233,199 B2 | 6/2007 | Westwick et al. | |
| 7,245,186 B2 | 7/2007 | Chang | |
| 7,310,019 B2 | 12/2007 | Gotou | |
| 7,466,205 B1 * | 12/2008 | Lin et al. | 330/310 |
| 2007/0096805 A1 * | 5/2007 | Kim et al. | 330/51 |

* cited by examiner

*Primary Examiner*—Henry K Choe
(74) *Attorney, Agent, or Firm*—SoCal IP Law Group LLP; John E. Gunther; Steven C. Sereboff

(57) ABSTRACT

A millimeter wave amplifier constructed on a substrate and configured for use at a frequency of 75 GHz or higher, may include four amplifier stages. A first inter-stage filter, resonant at an operating frequency of the amplifier, may couple the output of the first stage to the input of the second stage. A second inter-stage filter, resonant at the operating frequency, may couple the output of the second stage to the input of the third stage. A third inter-stage filter, resonant at the operating frequency, may couple the output of the third stage to the input of the fourth stage. A plurality of bias supply leads that couple a gate bias voltage and a drain bias voltage to each of the amplifier stages. A plurality of bias line filters, resonant at the operating frequency, may be connected from at least some of the bias supply leads to a ground plane.

20 Claims, 5 Drawing Sheets

US 7,804,366 B2

MILLIMETER WAVE MONOLITHIC INTEGRATED CIRCUITS

RELATED APPLICATION INFORMATION

This patent is a continuation-in-part of application Ser. No. 12/266,229, entitled MILLIMETER WAVE MONOLITHIC INTEGRATED CIRCUITS AND METHODS FOR FORMING SUCH INTEGRATED CIRCUITS, filed Nov. 6, 2008, the entire disclosure of which is incorporated herein by reference.

NOTICE OF COPYRIGHTS AND TRADE DRESS

A portion of the disclosure of this patent document contains material which is subject to copyright protection. This patent document may show and/or describe matter which is or may become trade dress of the owner. The copyright and trade dress owner has no objection to the facsimile reproduction by anyone of the patent disclosure as it appears in the Patent and Trademark Office patent files or records, but otherwise reserves all copyright and trade dress rights whatsoever.

BACKGROUND

1. Field

This disclosure relates generally to high frequency millimeter wave integrated circuit amplifiers, and more particularly to a multiple stage amplifier tuned to a specific operating frequency and having a serpentine signal path.

2. Description of the Related Art

The design and manufacture of high frequency, millimeter wave integrated circuit devices presents many challenges not found in the construction of other types of integrated circuits. However, the design and manufacture of circuits for operation in the W-band and above, frequencies of approximately 75 GHz and above, present particular challenges, as circuits and structures suitable for use even at lower millimeter wave frequencies, for example as may be suitable for devices operating at 30 GHz, do not function similarly or adequately at 75 GHz and above.

The placement and configuration of signal and voltage lines can present substantial problems of resonance or "ringing" of the circuits. These problems are heightened when the integrated circuit is an amplifier, particularly one having multiple stages and offering relatively high gain and power. In a high gain multiple stage amplifier, even a slight amount of feedback may cause self-oscillation. Such feedback may occur due to coupling through power lines and/or coupling between signal lines. An amplifier designed to occupy a minimal area on a substrate, for example a minimally-sized semiconductor die, may be particularly prone to oscillation due to feedback. However, forming such an amplifier on a minimally-sized die is highly advantageous from a cost perspective, as smaller die will yield more die per semiconductor wafer, thus providing more devices for essentially no increase in the cost of wafer processing. Additionally and importantly, from an application perspective, the smaller a die may be made, the less space it takes in a final system; and such smaller size is often a significant factor in the system design.

Conventional, relatively high power, multi-stage, millimeter wave amplifier integrated circuits are designed with relatively large spaces between signal lines and other components in order to avoid the above-described ringing and feedback. While these design rules are generally effective for such purposes, the resulting large spaces increase the total area occupied on a die by such an amplifier.

Additionally, with such conventional design methodologies, a substantial portion of the integrated circuit area may be devoted to distributing gate and drain bias voltages to the amplifier stages. One conventional approach to power distribution is to route one or more power buses along the periphery of the chip. A plurality of bypass capacitors may be provided form the power bus to ground to minimize noise on the power bus from the high-frequency signals being amplified. Individual leads may then connect from the power bus to each amplifier stage. A second conventional method for bias voltage distribution is to provide separate bias pads for each amplifier stage, which allows the use of external components to prevent noise or feedback from coupling between stages via the bias voltage distribution network. With either approach, the bias voltage distribution network may occupy a substantial area on the die. Accordingly, for such high frequency millimeter wave amplifiers, the conventional design criteria and methods tend to increase the size of the device where compactness would be an asset.

DETAILED DESCRIPTION

Description of Apparatus

The following description is based on an exemplary four-stage amplifier intended for operation at 95 GHz and configured to occupy a small die size relative to conventional amplifiers providing equivalent performance. The techniques and structure described herein may be scaled to amplifiers with more or fewer than four stages, and to frequencies less than or greater than 95 GHz.

Figure 1:
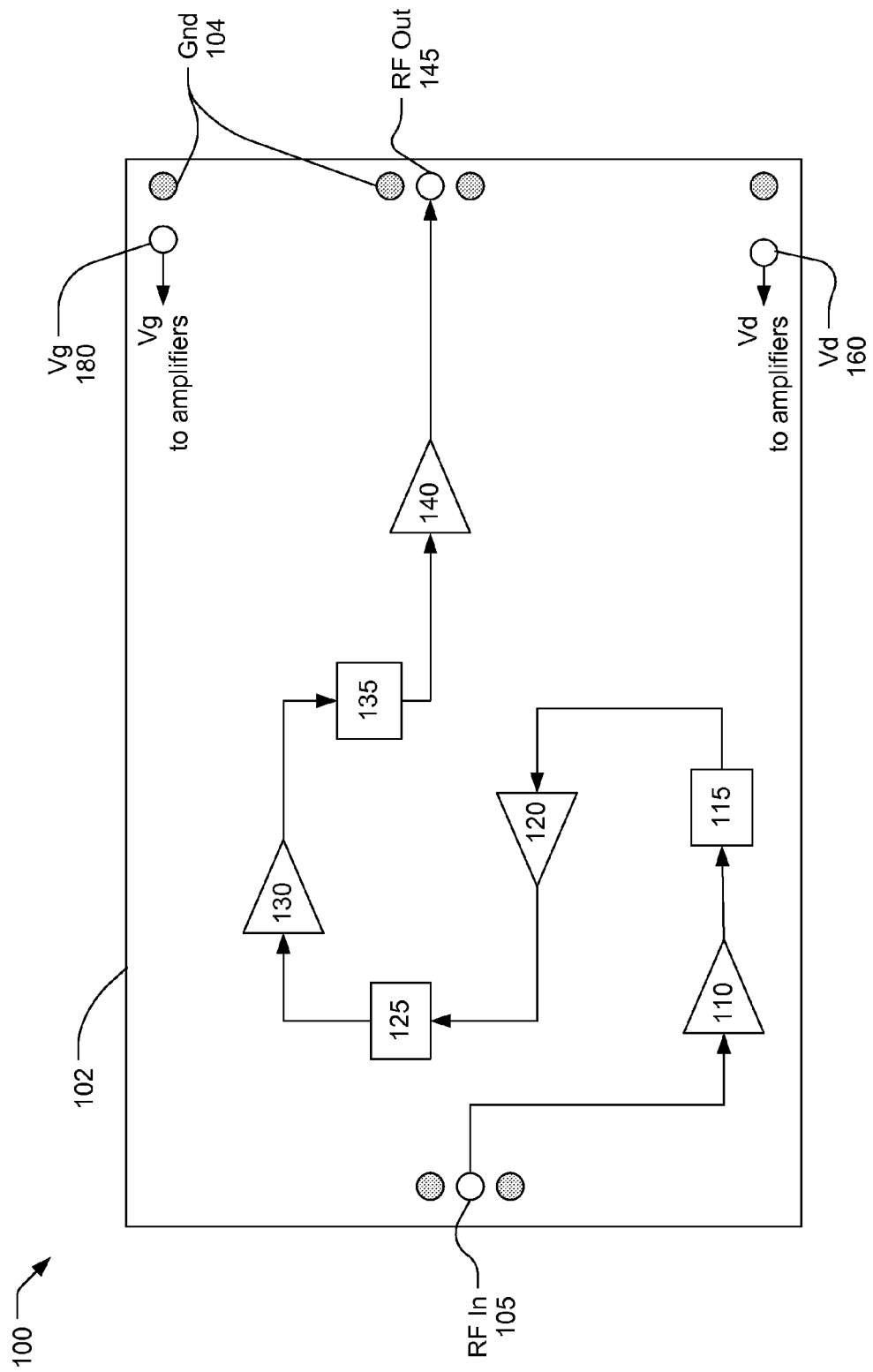
FIG. 1 shows a block diagram of an exemplary multiple stage amplifier.

Referring now to the block diagram of FIG. 1, the exemplary four-stage amplifier 100 may have first through fourth amplifier stages 110, 120, 130, 140 and first through third inter-stage coupling networks 115, 125, 135 formed on a semiconductor chip 102. An RF input signal to be amplified is introduced onto the semiconductor chip 102 at an RF input terminal 105. The RF input signal is amplified by the first amplifier stage 110 and then coupled to the input of the second amplifier stage 120 through the first inter-stage coupling network 115. The signal is then amplified by the second amplifier stage 120, coupled through the second inter-stage coupling network 125, amplifier by the third amplifier stage 130, coupled through the third inter-stage coupling network 135 and amplified by the fourth amplifier stage 140. The output from the fourth amplifier stage 140 exits the chip 102 at an RF Out pad 145. The four amplifier stages 110, 120, 130, 140 each receive a drain bias voltage Vd and a gate bias voltage Vg, which are introduced onto the die 102 at respective pads 160, 180.

The general layout of the block diagram of FIG. 1 mimics an exemplary layout of the amplifier 100 on the die 102. To allow the amplifier to be constructed within a small chip area, the direction of signal flow may follow a serpentine path on the chip. In this patent, a serpentine path is defined as a signal path that changes from a first direction to another direction generally opposed to the first direction at least twice. As shown in FIG. 1, the signal may flow from left to right through the first, third, and fourth amplifier stages 110, 130, 140, but may flow from right to left through the second amplifier stage. Terms referring to a specific direction (left, right, top, bottom, front, back, etc.) refer to the figures as shown and do not imply a specific physical orientation of the actual amplifier device.

Figure 2:
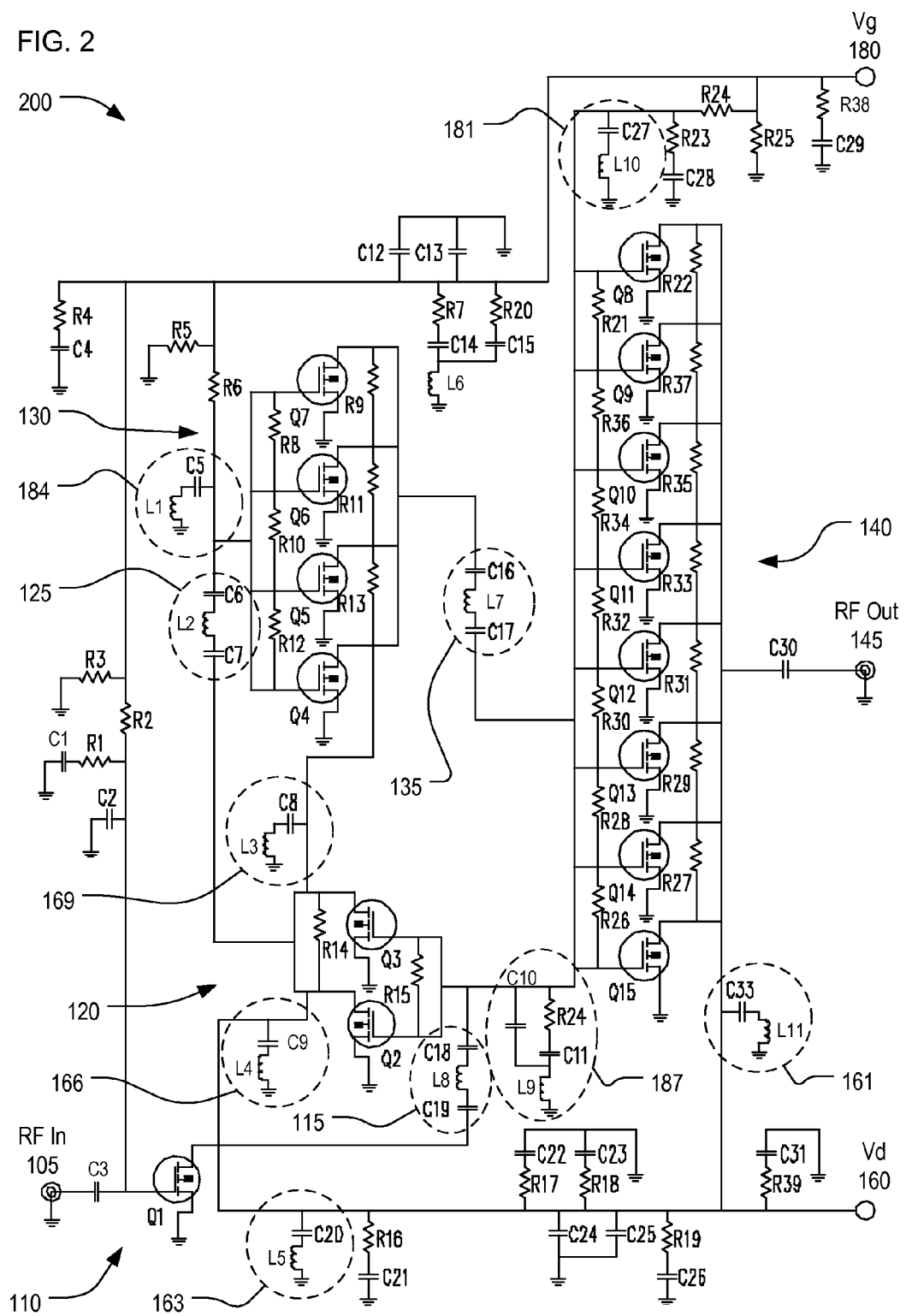
FIG. 2 shows a schematic diagram of an exemplary multiple stage amplifier.

FIG. 2 shows a simplified schematic diagram of an exemplary four-stage amplifier 200 which may be the amplifier 100. The schematic diagram of FIG. 2 does not show transmission line structures required to match impedances between various components. Further, for ease of explanation, some components implemented as transmission line structure as shown in the schematic diagram as discrete components.

The first amplifier stage 110 includes transistor Q1 and associated passive components. In this context, the term "passive components" encompasses resistors, capacitors, inductors, and transmission line structures. The second amplifier stage 120 includes transistors Q2 and Q3 and associated components. The third amplifier stage 130 includes transistors Q4, Q5, Q6, and Q7 and associated components. The fourth amplifier stage includes eight transistors Q8-Q15 and associated components.

The output signal from the first amplifier stage 110 may be coupled to the input of the second amplifier stage 120 through a first inter-stage coupling network 115 comprising a series combination of two capacitors C18, C19 and an inductor L8. Similarly, the output signal from the second amplifier stage 120 may be coupled to the input of the third amplifier stage 130 through a second inter-stage coupling network 125 (C6/C7/L2) and the output signal from the third amplifier stage 130 may be coupled to the input of the fourth amplifier stage 140 through a third inter-stage coupling network 155 (C16/C17/L7).

Each of the inter-stage coupling networks 115, 125, 135 may be resonant at a frequency of operation of the amplifier circuit 200, in which case each inter-stage coupling network 115, 125, 135 may have near-zero impedance at the frequency of operation and may have a substantially higher impedance at frequencies removed from the frequency of operation. Thus the overall gain of the amplifier 200 may be frequency dependent, with maximum gain provided at the frequency of operation.

A gate bias voltage Vg may be input at a Vg pad 180 and routed to the gate electrodes of the transistors Q1-Q15 through a plurality of gate bias voltage supply lines. A drain bias voltage Vd may be input at a Vd pad 160 and routed to the drain electrodes of the transistors Q1-Q15 through a plurality of drain bias voltage supply lines. Each inter-stage coupling network 115, 125, 135 may function as an open circuit for DC voltages to provide isolation between the drain bias voltage Vd at the output of each amplifier stage and the gate bias voltage Vg at the input of each subsequent amplifier stage. The gate bias voltage supply lines and the drain bias voltage supply lines may be connected to a plurality of bypass capacitors such as C12, C13, C24, and C25 effective to shunt high frequency currents flowing in bias voltage supply lines to ground. Additionally, gate bias voltage supply lines and the drain bias voltage supply lines may be connected to one or more resonant bias line filter circuits 161, 163, 166, 169, 181, 184, 187 which will be discussed subsequently. Each of the resonant bias line filter circuits 161, 163, 166, 169, 181, 184, 187 may be resonant at the frequency of operation of the amplifier 200. Thus each of the resonant bias line filter circuits 161, 163, 166, 169, 181, 184, 187 may have near-zero impedance at the frequency of operation of the amplifier 200 and have a very high DC impedance.

Figure 3:
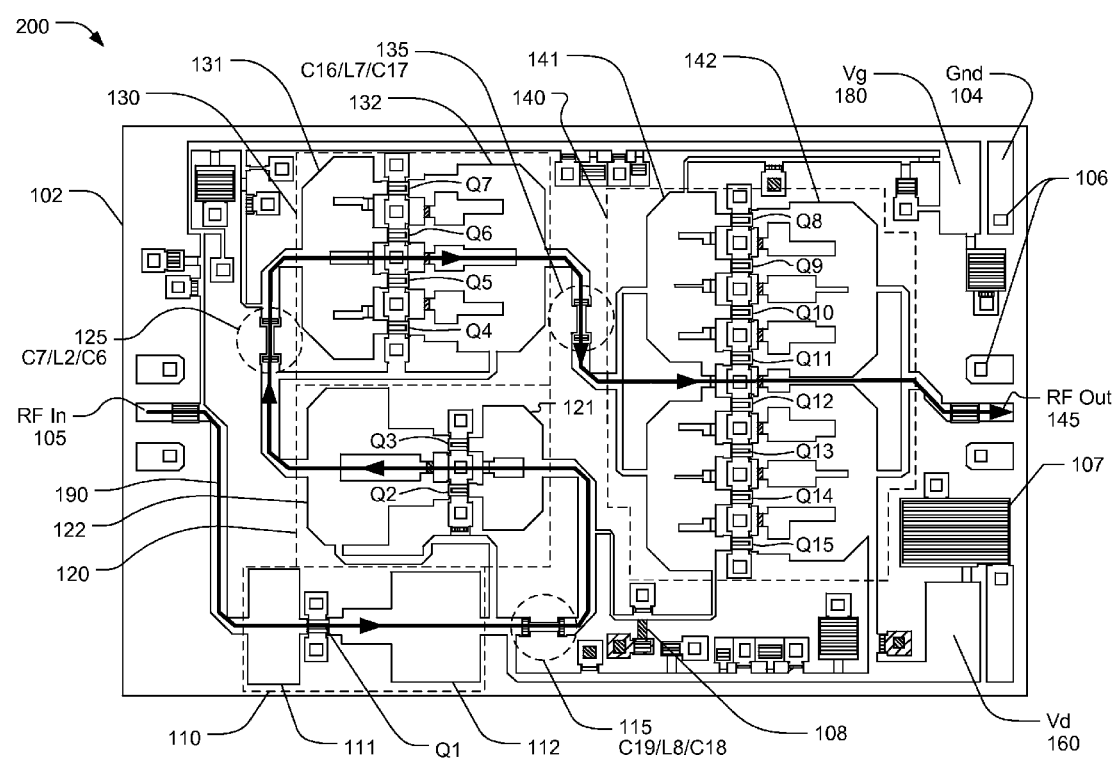
FIG. 3 depicts a physical layout of the exemplary amplifier of FIG. 2.

FIG. 3 shows an example layout for the four-stage amplifier 200 whose schematic diagram was previously shown in FIG. 2. As noted earlier herein, the amplifier 200 is intended for use at a frequency of 95 GHz. The amplifier 200 may provide at least 15 db of gain, and an output power of a least 1 Watt. To accommodate the amplifier 200, the integrated circuit chip 102 may have a surface area of no more than 5 square mm. As shown in FIG. 3, the amplifier 200 may be constructed within an area of approximately 4 square mm (allowing for minor variations in size of less than 5%, such as those resulting from the die singulation process or processing constraints).

In FIG. 3, small squares, as seen at 106, represent via contacts to a ground plane which may be the substrate of the chip 102 or which may be disposed on the rear surface of the chip 102. Structures with vertical or horizontal cross hatching, as seen at 107, represent multilayer capacitors. Structures with single diagonal cross hatching, as seen at 108, represent resistors. Not all of the resistors and capacitors shown in the schematic diagram of FIG. 2 are identified in FIG. 3.

The amplifier 200 includes the first amplifier stage 110, the second amplifier stage 120, the third amplifier stage 130, and the fourth amplifier stage 140, each of which is shown in FIG. 3 enclosed by a corresponding dashed outline. The first amplifier stage 110 includes transistor Q1, a gate/input pad 111, and a drain/output pad 112. The gate/input pad 111 may be configured as an impedance transformer to match the impedance of the gate of transistor Q1 to the impedance of a source connected to the RF In pad 105. The drain/output pad 112 may be configured as an impedance transformer to match the impedance of the drain of transistor Q1 to the impedance of a transmission line that connects the output of the first amplifier stage 110 to the input of the second amplifier stage 120.

The second amplifier stage 120 includes transistors Q2 and Q3, gate/input pad 121 and drain/output pad 122. The gate/input pad 121 may be configured to function both as an impedance transformer and as a power divider. The drain/output pad 121 may be configured to function both as an impedance transformer and as a power combiner. Similarly, the third amplifier stage 130 includes transistors Q4, Q5, Q6, and Q7, gate/input pad 131 and drain/output pad 132. The fourth amplifier stage includes transistors Q8-Q15, gate/input pad 141 and drain/output pad 142.

The drain/output pad 112, which represents the output of the first amplifier stage, is coupled to the gate/input pad 121, which represents the input of the second amplifier stage, through a transmission line and an inter-stage coupling network 115. The inter-stage coupling network 115 may act as an open circuit for DC voltages and thus provide isolation between the drain bias voltage applied to the drain/output pad 112 and the gate bias voltage applied to the gate/input pad 121. Similarly, inter-stage coupling network 125 may couple the output from the second amplifier stage 120 to the input of the third amplifier stage 130 and inter-stage coupling network 135 may couple the output from the third amplifier stage 130 to the input of the fourth amplifier stage 140.

The path of an RF signal through the amplifier 200 is indicated by a bold line 190 with periodic arrows indicating the signal propagation direction. The RF signal follows a serpentine path through the amplifier. The RF signal propagation direction is generally from left to right in the first amplifier stage 110, third amplifier stage 130, and fourth amplifier stage 140, but is generally from right to left in the second amplifier stage 130. Additionally, the first amplifier stage 110, the second amplifier stage 120, and the third amplifier stage 130 may be substantially aligned vertically on a left portion of the chip 102 and the fourth amplifier stage may occupy a right portion of the chip 102. Substantial alignment between stages is considered to exist where at least one-half the width of a stage is within the width of another stage. The vertical alignment of multiple amplifier stages in a limited chip area is accomplished through use of the above-described serpentine signal path.

The dimensions and shapes of the gate/input pads 111, 121, 131, 141 and the drain/output pads 112, 122, 132, 142 are sized and configured to provide appropriate impedance matching for the transition between the transistors of one stage to the transistors of the following stage. Each of the transistors Q1-Q15 may be a HEMT, or a high electron mobility transistor. Each of the transistors Q1-Q15 may be another transistor structure suitable for use at the frequency of operation of the amplifier 200. At least some of the gate/input pads 111, 121, 131, 141 and the drain/output pads 112, 122, 132, 142 been implemented with chamfered or rounded corners at the outer extent of such pads. The corners may be chamfered or rounded, as opposed to forming a right angle, to provide a smoother transition for signals through the pad. In the example of FIG. 3, the dimension of each angled surface forming the chamfer is approximately 70 to 140 microns long, representing a reduction of the length of each side forming a corner of about 50 to 100 microns, relative to the length that would be present with a right angle between those sides.

Figure 4:
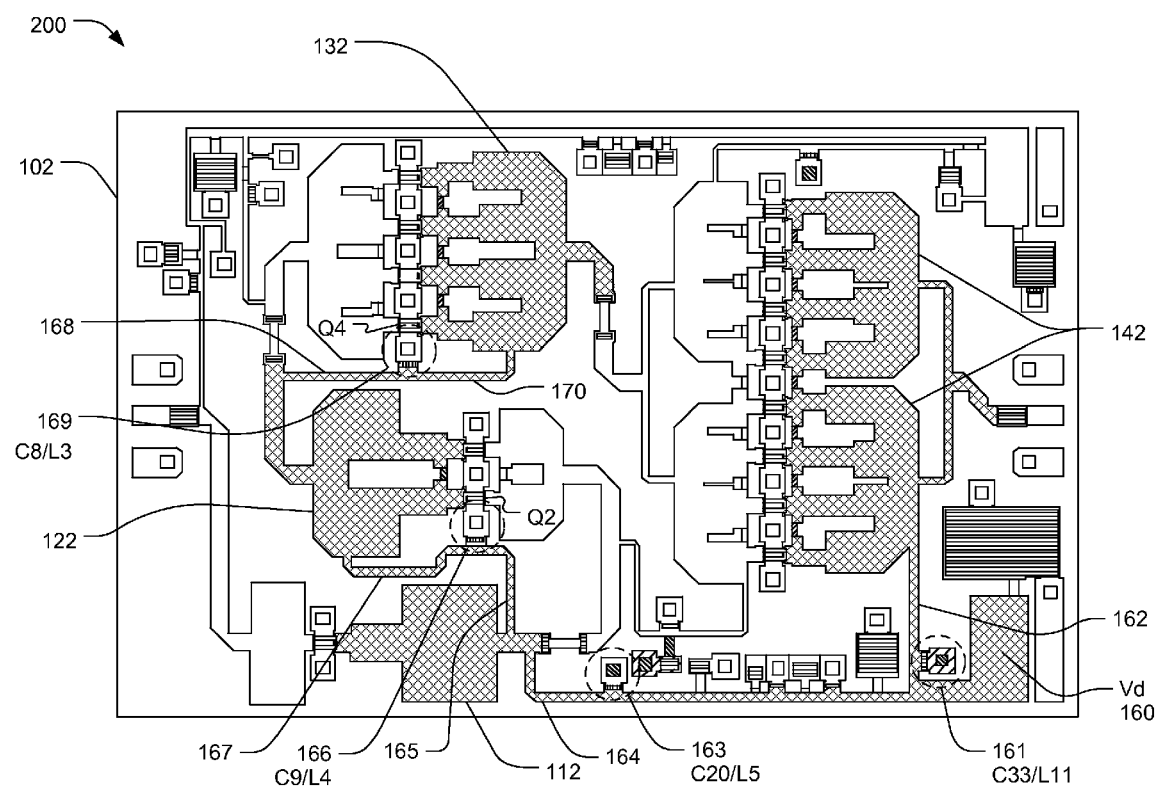
FIG. 4 shows the physical layout of the amplifier of FIG. 3 with specific identification of the drain bias paths within the amplifier.

FIG. 4 shows the layout of the amplifier 200, as shown in FIG. 3, but with the drain bias paths identified through double crosshatching. A drain bias voltage (Vd) pad 160 is connected through identified leads 162, 164, 165, 167, 168, 170 to the drain/output pads 112, 122, 132, 142 of each amplifier. For example, the drain bias voltage is connected to the drain/output pad 142 of the fourth amplifier stage through a lead 162. A plurality of series resonant bias line filters 161, 163, 166, 169 may be connected between the drain bias voltage leads and a ground plane on the chip 102. Each series resonant bias line filter 161, 163, 166, 169 may be implemented as a capacitor in series with an inductor, which may be the naturally occurring inductance of a via to the ground plane, according to the particular process used for the amplifier manufacture. The series resonant bias line filters may specifically tuned to resonate, and thus act as a short to ground, at an operating frequency of the amplifier 200.

Specifically, the lead 162 may be configured as a transmission line having an effective length, between the series resonant bias line filter 161 and the drain/output pad 142, of one-quarter of a wavelength at the frequency of operation. Since a short circuit in a transmission line is reflected as an open circuit at distances along the transmission line equal to odd multiples of one-quarter wavelength, the series resonant bias line filter 161 appears as an open circuit to the output (drain/output pad 142) of the fourth amplifier stage.

Similarly, the drain bias voltage is connected to the drain/output pad 121 of the first amplifier stage through a lead 164. A series resonant bias line filter 163 may be connected between the lead 164, and the ground plane. The lead 164 may be configured as a transmission line having an effective length, from the series resonant bias line filter 163 to the drain/output pad 122, of one-quarter wavelength at the frequency of operation of the amplifier 200.

As previously described, the first amplifier stage, the second amplifier stage and the third amplifier stage may be stacked vertically in a left portion of the chip 102. The drain bias voltage for the second amplifier stage and the third amplifier stage may be provided from the previous amplifier stage, as opposed to being provided from a separate pad (424, 426, 428, 430) or from a power bus (412) as shown in FIG. 4. Specifically, the drain bias voltage may be carried from the drain/output pad 112 of the first amplifier stage to the drain/output pad 122 of the second amplifier stage by leads 165 and 167 which run between the first and second amplifier stages. To reduce the potential for feedback from the output of the second amplifier stage, a series resonant bias line filter 166 may be connected between the junction of leads 165 and 167 and the ground plane. The total length of the leads 165 and 167 may be one-half wavelength at the frequency of operation of the amplifier 200. Specifically, the lead 165 may be configured as a transmission line having an effective length, from the drain/output pad 112 to the series resonant bias line filter 166, of one-quarter wavelength at the frequency of operation of the amplifier 200. The lead 167 may also be configured as a transmission line having an effective length, from the series resonant bias line filter 166 to the drain/output pad 122, of one-quarter wavelength at the frequency of operation of the amplifier 200. The series resonant bias line filter 166 may connect to the ground plane through a via which is shared by the source of transistor Q2.

Similarly, the drain bias voltage may be carried from the drain/output pad 122 of the second amplifier stage to the drain/output pad 132 of the third amplifier stage by leads 168 and 170 which run between the second and third amplifier stages. To reduce the potential for feedback from the output of the third amplifier stage, a series resonant bias line filter 169 may be connected between the junction of leads 168 and 170 and the ground plane. The lead 168 may be configured as a transmission line having an effective length, from the drain/output pad 122 to the series resonant bias line filter 169, of one-quarter wavelength at the frequency of operation of the amplifier 200. The lead 170 may also be configured as a transmission line having an effective length, from the series resonant bias line filter 169 to the drain/output pad 132, of one-quarter wavelength at the frequency of operation of the amplifier 200. The series resonant bias line filter 169 may connect to the ground plane through a via which is shared by the source of transistor Q4.

Figure 5:
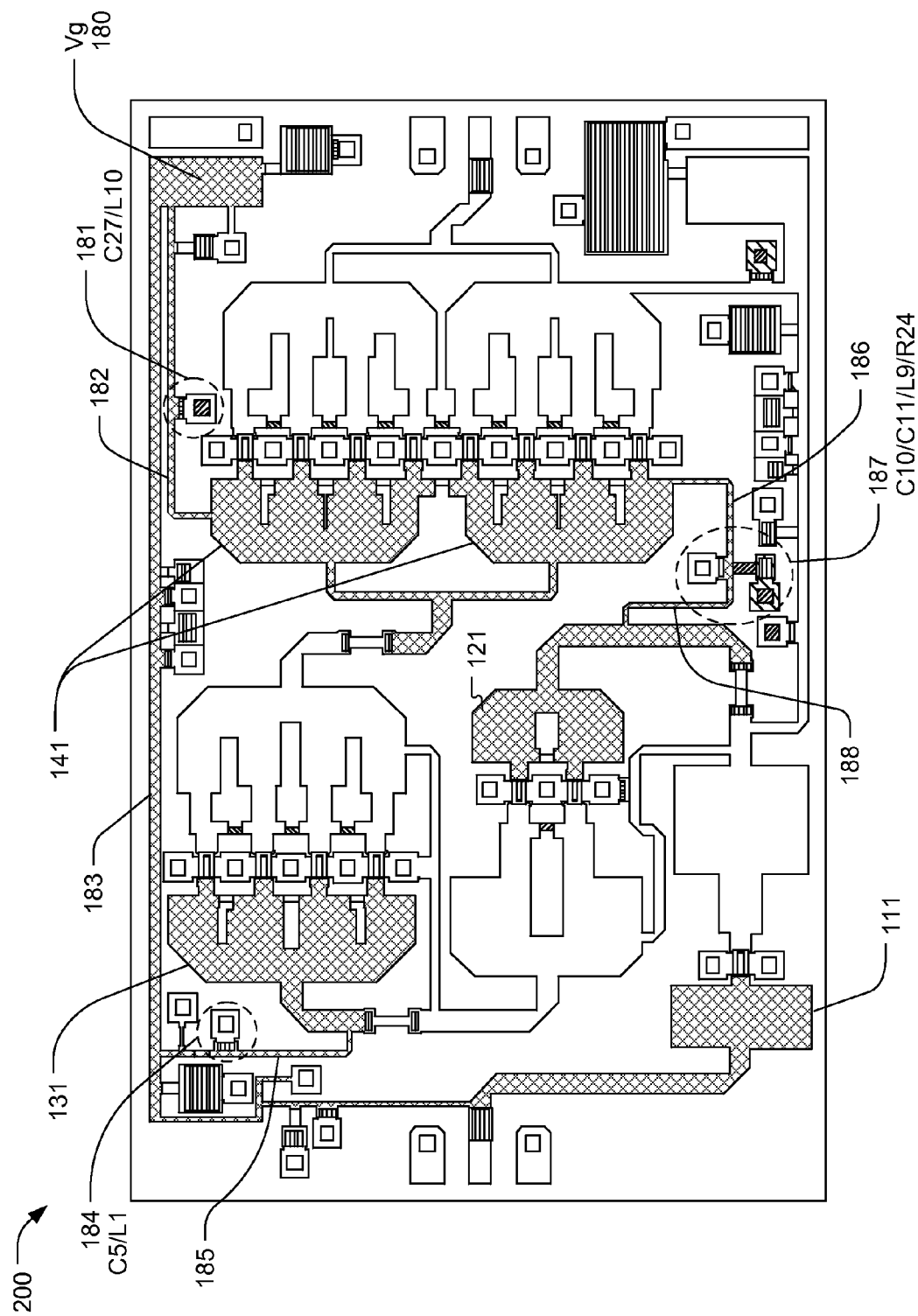
FIG. 5 shows the physical layout of the amplifier of FIG. 3 with specific identification of the gate bias paths within the amplifier.

FIG. 5 shows the layout of the amplifier 200, as shown in FIG. 3 and FIG. 4, but with the gate bias paths identified through double crosshatching. A gate bias voltage (Vg) pad 180 is connected through identified leads 182, 183, 185, 186, 188, 190 to the gate/input pads 111, 121, 131, 141 of each amplifier. For example, the gate bias voltage is connected to the gate/input pad 141 of the fourth amplifier stage through a lead 182. A plurality of series resonant bias line filters 181, 184, 187, may be connected between the gate bias voltage leads and a ground plane on the chip 102. Each series resonant bias line filter 181, 184, 187, may be or include a capacitor in series with an inductor, which may be the naturally occurring inductance of a via to the ground plane. The series resonant bias line filters may specifically tuned to resonate, and thus act as a short to ground, at an operating frequency of the amplifier 200.

As previously described, some of the gate bias leads may be configured as transmission lines having effective lengths, between one of the gate/input pads and an associated series resonant bias line filter, of one-quarter of a wavelength at the frequency of operation. Specifically, the lead 182 may be configured as a transmission line having an effective length, between the series resonant bias line filter 181 and the gate/input pad 141, of one-quarter of a wavelength at the frequency of operation. The lead 185 may be configured as a transmission line having an effective length, from the series resonant bias line filter 184 to the gate/input pad 131, of one-quarter wavelength at the frequency of operation of the amplifier 200.

As previously described, the first amplifier stage, the second amplifier stage and the third amplifier stage may be stacked vertically in a left portion of the chip 102. In this configuration, the gate bias voltage for the second amplifier stage may be conveniently provided from the fourth amplifier stage. Specifically, the gate bias voltage may be carried from the gate/input pad 141 of the fourth amplifier stage to the gate/input pad 121 of the second amplifier stage by leads 186 and 188 which run between the fourth and second amplifier stages. To reduce the potential for feedback from the input of the fourth amplifier stage to the input of the second amplifier stage, the series resonant bias line filter 187 may be connected between the junction of leads 186 and 188 and the ground plane. The lead 186 may be configured as a transmission line having an effective length, from the gate/input pad 141 to the series resonant bias line filter 187, of one-quarter wavelength at the frequency of operation of the amplifier 200. The lead 188 may also be configured as a transmission line having an effective length, from the series resonant bias line filter 187 to the gate/input pad 121, of one-quarter wavelength at the frequency of operation of the amplifier 200. The series resonant bias line filter 187 may include a capacitor in series with an inductor and additional components as necessary to prevent feedback from the fourth amplifier stage to the second amplifier stage.

In accordance with conventional design practices, the direct interconnection of an amplifier stage drain/output pad or gate/input pad to the drain/output pad or gate/input pad of a subsequent stage would lead to an expectation of increased crosstalk and/or coupling between stages, with the anticipated result of oscillations or other instabilities within amplifier 200. These anticipated instabilities are addressed in the amplifier 200 through the use of the resonant inter-stage coupling networks 115, 125, 135 which are tuned to the operating frequency of the amplifier 200 and the use of the resonant bias line filters 161, 163, 166, 169, 181, 184, 187 which are tuned to the same frequency. In order for an amplifier to oscillate, there must be feedback around one or more stages of the amplifier with a suitable phase shift and a loop gain (gain of the amplifiers stages times the losses in the feedback path) greater than one. At the intended operating frequency, the gain of each stage of the amplifier 200 may be high, since the inter-stage coupling networks function essentially as short-circuits at their resonant frequency. However, feedback through the bias lines may be strongly attenuated at this frequency by the series resonant bias line filters, which also act as short circuits at this frequency. Consequentially, the overall loop gain may not be sufficient to support oscillation. At frequencies removed from the operating frequency, feedback through the bias lines may not be attenuated as strongly, but the gain of the amplifier stages may be low due to the high impedance of the inter-stage coupling networks. The overall loop gain at frequencies other than the intended operating frequency may also be too low to support oscillation. Thus the amplifier 200 may be constructed with the gate and/or drain bias for at least some stages provided directly from other stages without introducing oscillation or other instability.

The specific configuration of components, and the selection of appropriate values for components will be virtually completely dependent upon the specific parameters, design and implementation of such an amplifier.

The amplifier 200 was developed through electromagnetic modeling of the desired structure. Such modeling may be performed through use of software such as that marketed under the name of Agilent ADS, by Agilent Technologies, Inc., of Santa Clara, Calif. Additionally, it has been found useful to model and simulate the device in the context of a larger circuit in which it is to be used. That simulation and modeling may be performed through use of Ansoft HFSS software, offered by Ansoft LLC, a subsidiary of ANSYS, Inc. Because virtually every component and its physical structure on the die has the potential to impact the overall stability of the constructed device, such electromagnetic modeling allows fine-tuning of the components and the layout to achieve a balanced and operative device. For example, the dimensions of each the gate/input pads 111, 121, 131, 141 and drain/output pads 112, 122, 132, 142; the size and position of each lead; the number and location of series resonant bias line filters and other bias line bypass components; and the size and locations of the inter-stage filters may be iteratively determined and adjusted through such modeling.

Closing Comments

Throughout this description, the embodiments and examples shown should be considered as exemplars, rather than limitations on the apparatus and procedures disclosed or claimed. Although many of the examples presented herein involve specific combinations of method acts or system elements, it should be understood that those acts and those elements may be combined in other ways to accomplish the same objectives. With regard to flowcharts, additional and fewer steps may be taken, and the steps as shown may be combined or further refined to achieve the methods described herein. Acts, elements and features discussed only in connection with one embodiment are not intended to be excluded from a similar role in other embodiments.

As used herein, "plurality" means two or more. As used herein, a "set" of items may include one or more of such items. As used herein, whether in the written description or the claims, the terms "comprising", "including", "carrying", "having", "containing", "involving", and the like are to be understood to be open-ended, i.e., to mean including but not limited to. Only the transitional phrases "consisting of" and "consisting essentially of", respectively, are closed or semi-closed transitional phrases with respect to claims. Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements. As used herein, "and/or" means that the listed items are alternatives, but the alternatives also include any combination of the listed items.

It is claimed:

1. A millimeter wave amplifier constructed on a substrate, comprising:
    a first amplifier stage;
    a first inter-stage coupling network, resonant at an operating frequency of the amplifier, that couples an output of the first amplifier stage to an input of a second amplifier stage
    a second inter-stage coupling network, resonant at the operating frequency, that couples an output of the second amplifier stage to an input of a third amplifier stage;
    a third inter-stage coupling network, resonant at the operating frequency, that couples an output of the third amplifier stage to an input of a fourth amplifier stage;

a plurality of bias supply leads that couple a gate bias voltage and a drain bias voltage to each of the amplifier stages; and a plurality of resonant bias line filters, resonant at the operating frequency, connected between at least some of the bias supply leads and a ground plane wherein:

the signal path through the first amplifier stage flows in a first direction, the signal path through the second amplifier stage flows in a second direction generally opposed to the first direction, and the signal path through the third amplifier stage flows in the first direction.

2. A millimeter wave amplifier, constructed on a substrate, comprising:

a first amplifier stage:, a first inter-stage coupling network, resonant at an operating frequency of the amplifier, that couples an output of the first amplifier stage to an input of a second amplifier stage a second inter-stage coupling network, resonant at the operating frequency, that couples an output of the second amplifier stage to an input of a third amplifier stage:, a third inter-stage coupling network, resonant at the operating frequency, that couples an output of the third amplifier stage to an input of a fourth amplifier stage:, a plurality of bias supply leads that couple a gate bias voltage and a drain bias voltage to each of the amplifier stages; and a plurality of resonant bias line filters, resonant at the operating frequency, connected between at least some of the bias supply leads and a ground plane, wherein each amplifier stage comprises:

a gate/input pad;

a drain/output pad; and one or more transistors coupled between the gate/input pad and the drain/output pad, wherein:

the drain bias voltage is provided to the drain/output pad of an amplifier stage via a first lead connected directly to the drain/output pad of another amplifier stage, the first lead has an effective length of about one-half of the wavelength of the operating frequency, and a first resonant bias line filter is connected from a midpoint of the first lead to the ground plane.

3. The millimeter wave amplifier of claim 2, wherein:

the first lead connects the drain/output pad of the third amplifier stage directly to the drain/output pad of the second amplifier stage, the drain bias voltage is provided to the drain/output pad of the second amplifier stage via a second lead connected directly to the drain/output pad of the first amplifier stage, the second lead has an effective length of about one-half of the wavelength of the operating frequency, and a second resonant bias line filter is connected from a mid point of the second lead to the ground plane.

4. A millimeter wave amplifier, constructed on a substrate, comprising:

a first amplifier stage:, a first inter-stage coupling network, resonant at an operating frequency of the amplifier, that couples an output of the first amplifier stage to an input of a second amplifier stage a second inter-stage coupling network, resonant at the operating frequency, that couples an output of the second amplifier stage to an input of a third amplifier stage;

a third inter-stage coupling network, resonant at the operating frequency, that couples an output of the third amplifier stage to an input of a fourth amplifier stage:, a plurality of bias supply leads that couple a gate bias voltage and a drain bias voltage to each of the amplifier stages; and a plurality of resonant bias line filters, resonant at the operating frequency, connected between at least some of the bias supply leads and a ground plane, wherein each amplifier stage comprises:

a gate/input pad;

a drain/output pad; and one or more transistors coupled between the gate/input pad and the drain/output pad, wherein:

the gate bias voltage is provided to the gate/input pad of an amplifier stage via a third lead connected directly to the gate/input pad of another amplifier stage, the third lead has an effective length of about one-half of the wavelength of the operating frequency, and a third resonant bias line filter is connected from a mid point of the first lead to the ground plane.

5. A millimeter wave amplifier, constructed on a substrate, comprising:

a first amplifier stage:, a first inter-stage coupling network, resonant at an operating frequency of the amplifier, that couples an output of the first amplifier stage to an input of a second amplifier stage a second inter-stage coupling network, resonant at the operating frequency, that couples an output of the second amplifier stage to an input of a third amplifier stage:, a third inter-stage coupling network, resonant at the operating frequency, that couples an output of the third amplifier stage to an input of a fourth amplifier stage:, a plurality of bias supply leads that couple a gate bias voltage and a drain bias voltage to each of the amplifier stages; and a plurality of resonant bias line filters, resonant at the operating frequency, connected between at least some of the bias supply leads and a ground plane, wherein each amplifier stage comprises:

a gate/input pad;

a drain/output pad; and one or more transistors coupled between the gate/input pad and the drain/output wherein:

the drain bias voltage is provided to the drain/output pad of the third amplifier stage via a first lead connected directly to the drain/output pad of the second amplifier stage, the drain bias voltage is provided to the drain/output pad of the second amplifier stage via a second lead connected directly to the drain/output pad of the first amplifier stage, the gate bias voltage is provided to the gate/input pad of the second amplifier stage via a third lead connected directly to the gate/input pad of the fourth amplifier stage, the first, second, and third leads each have an effective length of about one-half of the wavelength of the operating frequency, and first, second, and third resonant bias line filters are connected from mid points of the first, second, and third leads, respectively, to the ground plane.

6. The millimeter wave amplifier of claim 1, configured to provide a signal gain of at least 15 db, and an output power of at least 1 Watt.

7. The millimeter wave amplifier of claim 6, configured to occupy an area on the substrate of no greater than 5 square millimeters.

8. A millimeter wave amplifier constructed on a substrate, comprising:
   a first amplifier stage comprising at least one transistor operatively coupled between a first gate/input pad and a first drain/output pad;
   a second amplifier stage comprising at least one transistor operatively coupled between a second gate/input pad and a second drain/output pad;
   a first inter-stage filter, resonant at an operating frequency of the amplifier, that couples the first drain/output pad to the second gate/input pad;
   a first bias line that electrically connects the first drain/output pad to the second drain/output pad; and
   a first bias line filter, resonant at the operating frequency, connected between the first bias line and a ground plane wherein:
      a length of a portion of the first bias line from the first drain/output pad to a point of connection with the first bias line filter is about one-quarter wavelength at the operating frequency, and
      a length of another portion of the first bias line, from the point of connection with the first bias line filter to the second drain/output pad, is about one-quarter wavelength at the operating frequency.

9. A millimeter wave amplifier constructed on a substrate, comprising:
   a first amplifier stage comprising at least one transistor operatively coupled between a first gate/input pad and a first drain/output pad;
   a second amplifier stage comprising at least one transistor operatively coupled between a second gate/input pad and a second drain/output pad;
   a first inter-stage filter, resonant at an operating frequency of the amplifier, that couples the first drain/output pad to the second gate/input pad;
   a first bias line that electrically connects the first drain/output pad to the second drain/output pad; and
   a first bias line filter, resonant at the operating frequency, connected between the first bias line and a ground plane wherein the first bias line filter comprises a capacitor in series with an inductor formed by a via contact to the ground plane.

10. The millimeter wave amplifier of claim 9, wherein the first bias line filter shares the via contact with the source of a transistor in one of the first amplifier and the second amplifier.

11. The millimeter wave amplifier of claim 2, configured to provide a signal gain of at least 15 db, and an output power of at least 1 Watt.

12. The millimeter wave amplifier of claim 11, configured to occupy an area on the substrate of no greater than 5 square millimeters.

13. The millimeter wave amplifier of claim 4, configured to provide a signal gain of at least 15 db, and an output power of at least 1 Watt.

14. The millimeter wave amplifier of claim 13, configured to occupy an area on the substrate of no greater than 5 square millimeters.

15. The millimeter wave amplifier of claim 5, configured to provide a signal gain of at least 15 db, and an output power of at least 1 Watt.

16. The millimeter wave amplifier of claim 15, configured to occupy an area on the substrate of no greater than 5 square millimeters.

17. The millimeter wave amplifier of claim 8, configured to provide a signal gain of at least 15 db, and an output power of at least 1 Watt.

18. The millimeter wave amplifier of claim 17, configured to occupy an area on the substrate of no greater than 5 square millimeters.

19. The millimeter wave amplifier of claim 9, configured to provide a signal gain of at least 15 db, and an output power of at least 1 Watt.

20. The millimeter wave amplifier of claim 19, configured to occupy an area on the substrate of no greater than 5 square millimeters.

* * * * *